(12) United States Patent
Karasaki et al.

(10) Patent No.: US 10,607,846 B2
(45) Date of Patent: Mar. 31, 2020

(54) METHOD OF MANUFACTURING ELEMENT CHIP

(71) Applicant: Panasonic Intellectual Property Management Co., Ltd., Osaka (JP)

(72) Inventors: Hidehiko Karasaki, Hyogo (JP);
Noriyuki Matsubara, Osaka (JP);
Atsushi Harikai, Osaka (JP); Hidefumi Saeki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/103,025

(22) Filed: Aug. 14, 2018

(65) Prior Publication Data

US 2019/0074185 A1 Mar. 7, 2019

(30) Foreign Application Priority Data

Sep. 7, 2017 (JP) .................. 2017-172366

(51) Int. Cl.
*H01L 21/00* (2006.01)
*H01L 21/3065* (2006.01)
*B23K 26/0622* (2014.01)
*H01L 21/02* (2006.01)
*H01L 21/475* (2006.01)
*H01L 21/67* (2006.01)
(Continued)

(52) U.S. Cl.
CPC ...... *H01L 21/3065* (2013.01); *B23K 26/0624* (2015.10); *H01L 21/02076* (2013.01); *H01L 21/475* (2013.01); *H01L 21/67069* (2013.01);

*H01L 21/6836* (2013.01); *H01L 21/78* (2013.01); *H01L 2221/68327* (2013.01)

(58) Field of Classification Search
None
See application file for complete search history.

(56) References Cited

U.S. PATENT DOCUMENTS 8,703,581 B2 4/2014 Lei et al.
2012/0322233 A1 12/2012 Lei et al.
(Continued)

FOREIGN PATENT DOCUMENTS

JP 2015-159296 A 9/2015
JP 2016-171262 A 9/2016
JP 6113214 B2 4/2017

*Primary Examiner* — Evren Seven
(74) *Attorney, Agent, or Firm* — Pearne & Gordon LLP

(57) ABSTRACT

Method of manufacturing an element chip which can suppress residual debris in plasma dicing. A back surface of a semiconductor wafer is held on a dicing tape. Then, a surface of the wafer is coated with a mask that includes a water-insoluble lower mask and a water-soluble upper mask. Subsequently, an opening is formed in the mask by irradiating the mask with laser light to expose a dividing region. Then, the semiconductor wafer is caused to come into contact with water to remove the upper mask covering each of the element regions while leaving the lower layer. After that, the wafer is exposed to plasma to perform etching on the dividing region exposed from the opening until the etching reaches the back surface, thereby dicing the semiconductor wafer into a plurality of element chips. Thereafter, the lower layer mask left on the front surface of the semiconductor chips is removed.

5 Claims, 15 Drawing Sheets

(51) Int. Cl.
*H01L 21/683* (2006.01)
*H01L 21/78* (2006.01)

(56) References Cited

U.S. PATENT DOCUMENTS

| | | | |
|---|---|---|---|
| 2012/0322237 A1* | 12/2012 | Lei | H01L 21/78 |
| | | | 438/462 |
| 2014/0038389 A1* | 2/2014 | Kobayashi | H01L 21/78 |
| | | | 438/460 |
| 2014/0174659 A1 | 6/2014 | Lei et al. | |
| 2016/0035577 A1* | 2/2016 | Lei | H01L 21/78 |
| | | | 438/462 |
| 2016/0181140 A1* | 6/2016 | Moriyama | B32B 27/00 |
| 2016/0351510 A1* | 12/2016 | Mori | H01L 23/562 |
| 2017/0372936 A1* | 12/2017 | Mori | H01L 21/683 |
| 2018/0012787 A1 | 1/2018 | Oka et al. | |
| 2018/0151405 A1* | 5/2018 | Moriyama | H01L 21/304 |
| 2018/0286737 A1* | 10/2018 | Moriyama | H01L 24/81 |
| 2018/0342422 A1* | 11/2018 | Li | H01L 21/02076 |
| 2018/0345418 A1* | 12/2018 | Lei | H01L 21/6836 |
| 2019/0074437 A1* | 3/2019 | Tada | H01L 45/1266 |
| 2019/0221479 A1* | 7/2019 | Okita | H01L 21/78 |

* cited by examiner

METHOD OF MANUFACTURING ELEMENT CHIP

CROSS-REFERENCE TO RELATED APPLICATIONS

This application claims priority of Japanese Patent Application No. 2017-172366 filed on Sep. 7, 2017, the contents of which are incorporated herein by reference.

BACKGROUND OF INVENTION

Field of the Invention

The present invention relates to a method of manufacturing an element chip.

Description of the Related Art

Plasma etching may be used to manufacture element chips in some cases. There are wide applications of plasma etching, and for example, a method called plasma dicing for dicing a substrate is known as one of them. In plasma dicing, a substrate that has a plurality of element regions defined by a dividing region is diced into respective element chips by performing plasma etching on the dividing region from one surface to the other surface of the substrate. In such plasma dicing, only the dividing region needs to be plasma etched, that is, the element regions need to be protected from plasma. For this reason, before the plasma etching, a mask having plasma resistance is formed over the entire surface of the substrate, and then a part of the mask located in the dividing region is removed while leaving parts of the mask located in the element regions, thereby forming a finalized mask for plasma etching in each necessary region. At the same time, patterning is also performed to cut parts of a protective film or a layer thereunder in the dividing region by laser machining or the like. In this way, the regions to be plasma etched are defined, and consequently accurate plasma dicing is performed (see, for example, U.S. Pat. No. 8,703,581).

When plasma dicing is performed on a substrate with a metal layer, a process (laser grooving process) for providing grooves is applied to a protective film and the metal layer thereunder, which are patterned. During this process, processing waste called debris, generated by an ablation phenomenon, may often be scattered. Most of the scattered debris can be removed by plasma cleaning or the like in a later step, but some of the debris having a large particle size remain without being removed, which may deteriorate the reliability and yield of a device.

SUMMARY OF THE INVENTION

Therefore, it is an object of the present invention to provide a method of manufacturing an element chip which can suppress residual debris in plasma dicing.

The present invention provides a method of manufacturing an element chip, comprising: preparing a substrate that includes a plurality of element regions and a dividing region defining the element regions, the substrate having a first surface and a second surface opposite to the first surface; holding the second surface of the substrate onto a holding sheet; coating the first surface of the substrate with a mask, the mask including a water-insoluble lower layer and a water-soluble upper layer; forming an opening in the mask by irradiating the mask with laser light to expose the dividing region of the substrate from the opening; causing the substrate to come into contact with water or an aqueous solution to remove the upper layer of the mask covering each of the element regions while leaving the lower layer; exposing the substrate to first plasma to perform etching on the dividing region exposed from the opening until the etching reaches the second surface, thereby dicing the substrate into a plurality of element chips, so that the plurality of element chips is held on the holding sheet; and removing the mask left on a surface of each of the plurality of element chips, so that the plurality of element chips, each having the mask removed therefrom, is held on the holding sheet.

According to this method, since the water-soluble upper layer is formed on the first surface of the substrate before the laser grooving process, debris can be removed together with the upper layer by washing with water, even when the debris generated in the laser grooving process is scattered to adhere to the upper surface. Therefore, the residual debris in plasma dicing can be suppressed, thereby making it possible to suppress the occurrence of processing defects due to the residual debris during the plasma dicing, thus improving the reliability of the element chip as a product.

The removal of the mask from the surface of each of the plurality of chips may include ashing with the second plasma.

According to this method, the water-insoluble lower layer of the mask can be easily removed by ashing with the second plasma.

The coating with the mask may include forming the lower layer by applying a raw material solution containing a water-insoluble resin to the first surface of the substrate held on the holding sheet, and then forming the upper layer by applying a raw material solution containing a water-soluble resin.

According to this method, the upper layer and the lower layer of the mask can be formed by applying a raw material solution. In this way, the upper layer and the lower layer can be easily formed.

Before holding the substrate on the holding sheet, a protective tape including a base material and a water-insoluble adhesive layer may be attached to the first surface via the adhesive layer, and the coating with the mask may include peeling the base material of the protective tape from the substrate to leave the adhesive layer as the lower layer on the first surface of the substrate, and forming the upper layer on the lower layer.

According to this method, the adhesive layer of the protective tape can be used as the lower layer, thereby simplifying the mask formation step.

According to the present invention, in the method of manufacturing an element chip, since the water-soluble upper layer is formed on the first surface of the substrate before the laser grooving process, debris can be removed together with the upper layer by washing with water, even when the debris generated in the laser grooving process is scattered to adhere to the upper surface. Therefore, residual debris in plasma dicing can be suppressed.

DETAILED DESCRIPTION OF THE INVENTION

Embodiments of the present invention will be described below with reference to the accompanying drawings.

(First Embodiment)

Figure 1A:
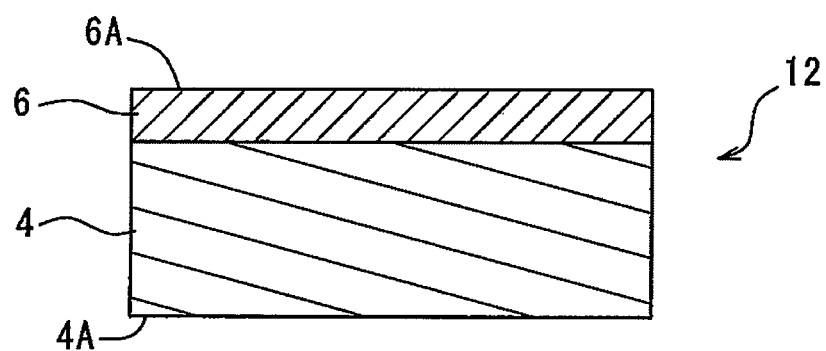
FIG. 1A is a cross-sectional view showing a first preparation step in a method of manufacturing an element chip according to a first embodiment of the present invention.
Figure 1B:
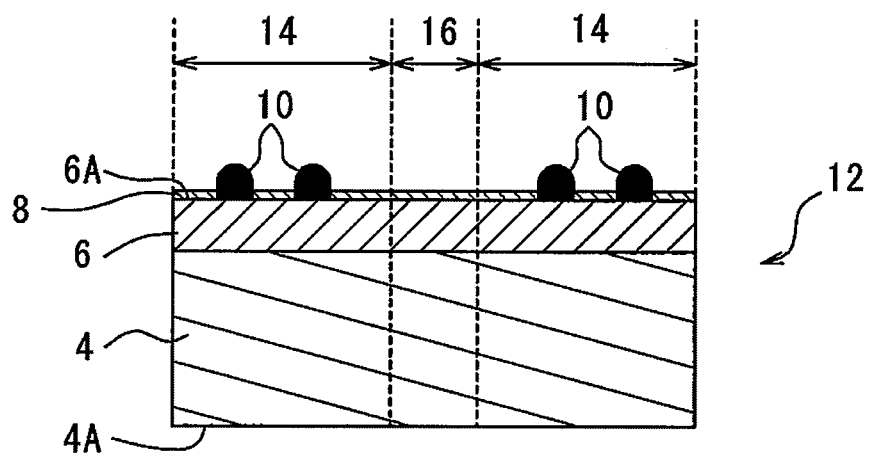
FIG. 1B is a cross-sectional view showing a second preparation step in the method of manufacturing an element chip.
Figure 1C:
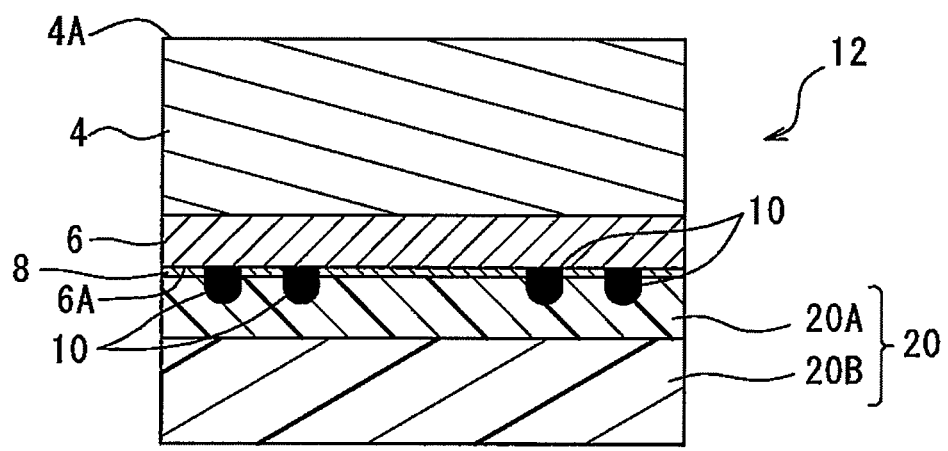
FIG. 1C is a cross-sectional view showing a protection step in the method of manufacturing an element chip.
Figure 1D:
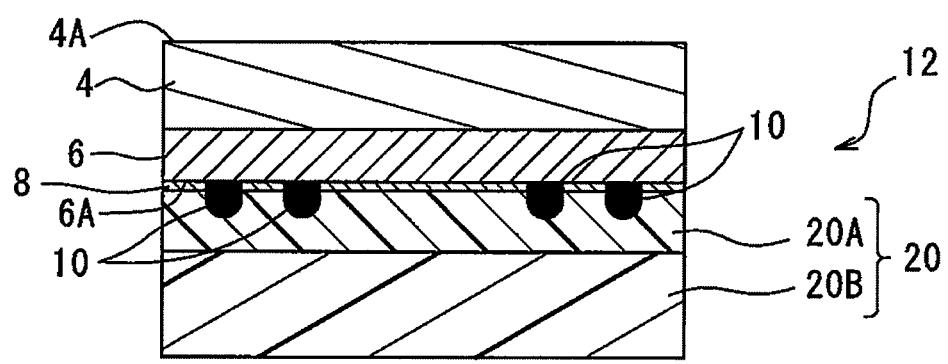
FIG. 1D is a cross-sectional view showing a thinning step in the method of manufacturing an element chip.
Figure 1E:
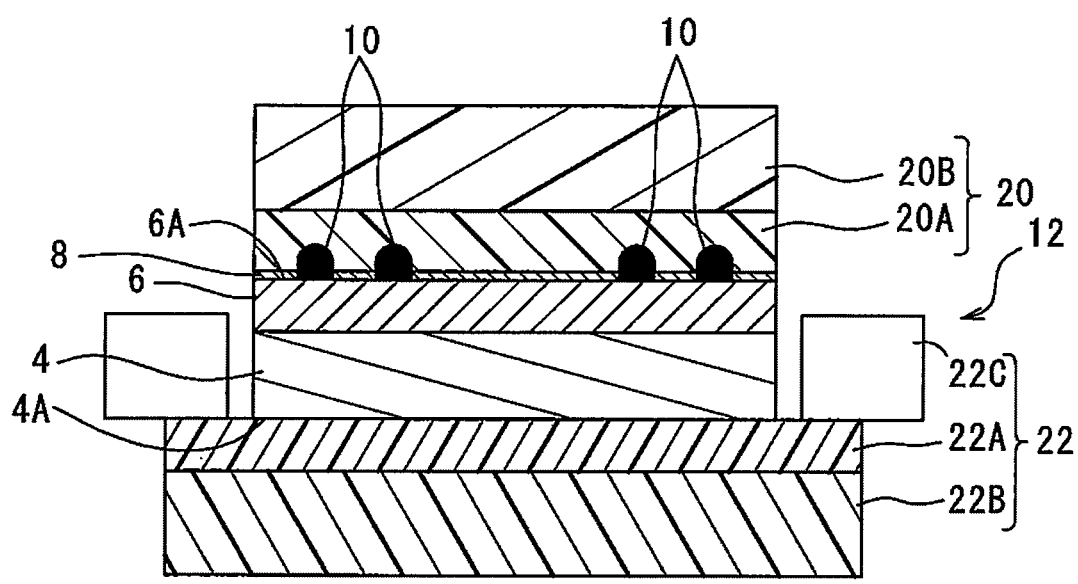
FIG. 1E is a cross-sectional view showing a first holding step in the method of manufacturing an element chip.
Figure 1F:
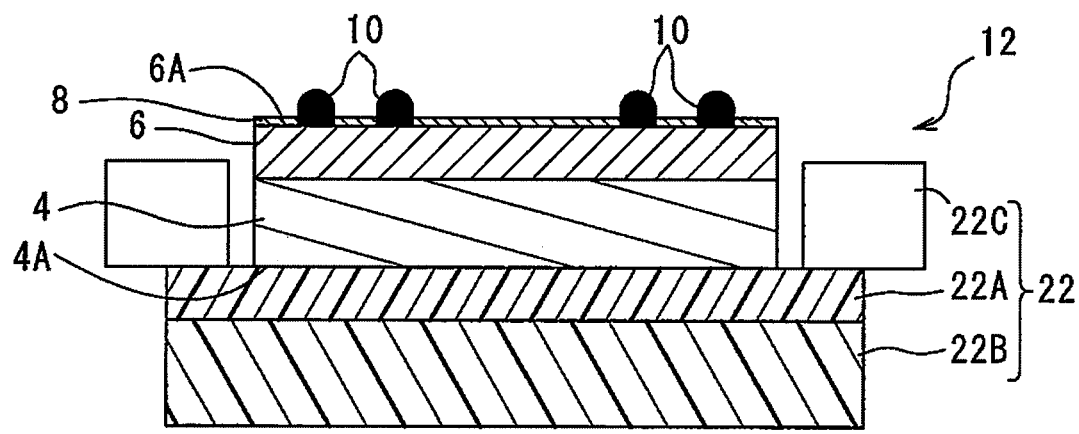
FIG. 1F is a cross-sectional view showing a second holding step in the method of manufacturing an element chip.
Figure 1G:
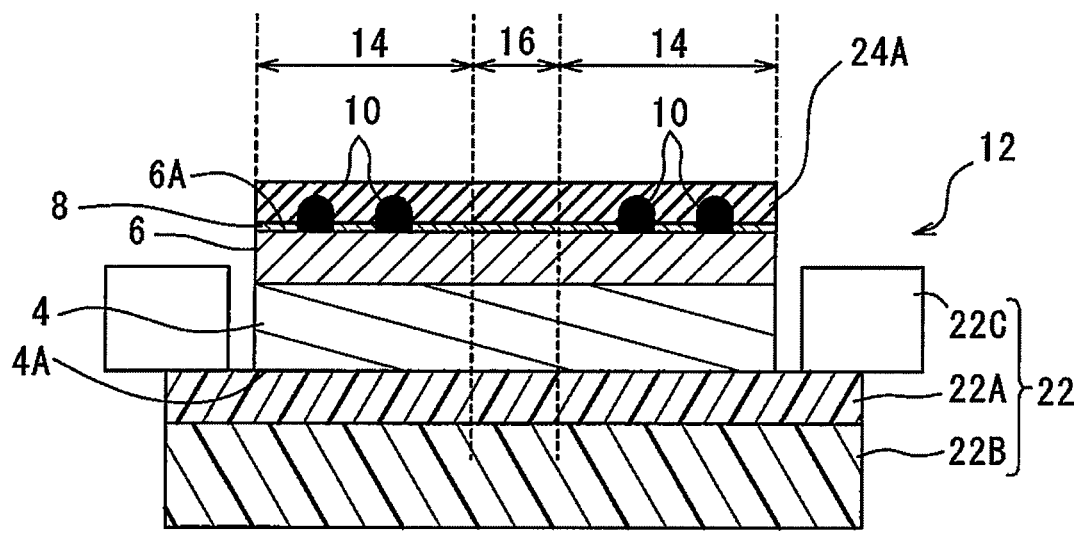
FIG. 1G is a cross-sectional view showing a first mask formation step in the method of manufacturing an element chip.
Figure 1H:
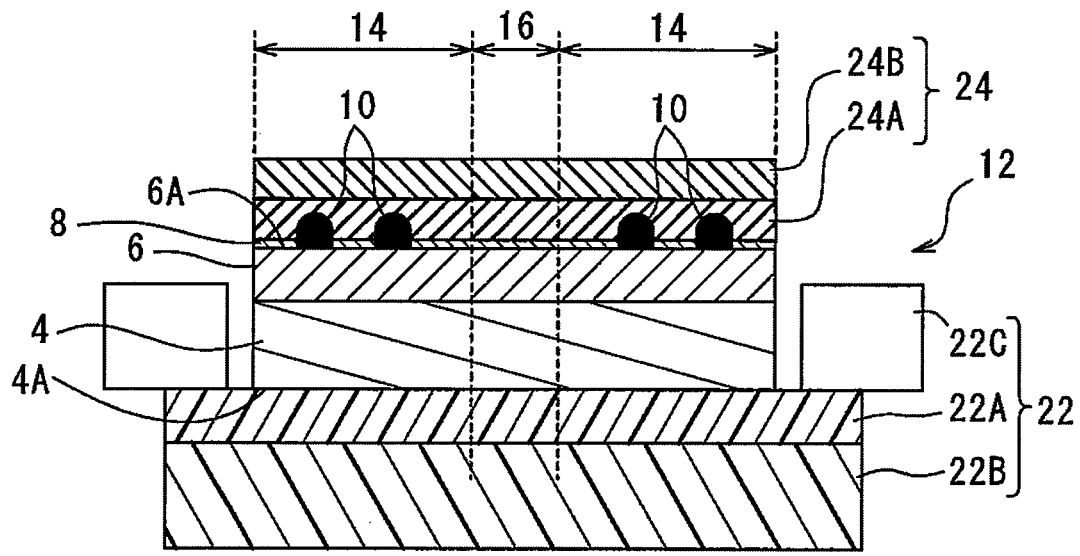
FIG. 1H is a cross-sectional view showing a second mask formation step in the method of manufacturing an element chip.
Figure 1I:
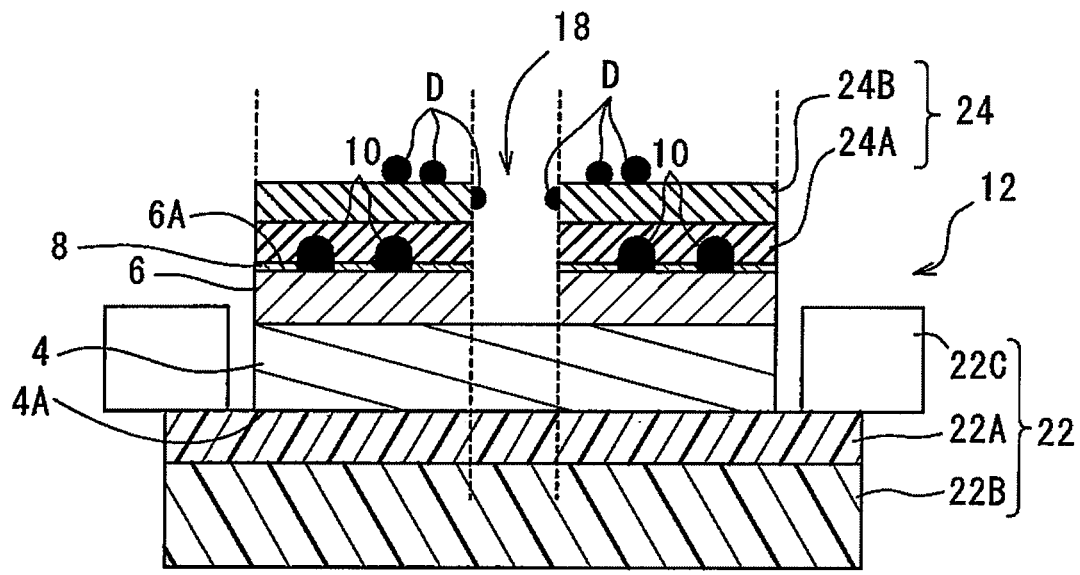
FIG. 1I is a cross-sectional view showing a patterning step in the method of manufacturing an element chip.
Figure 1J:
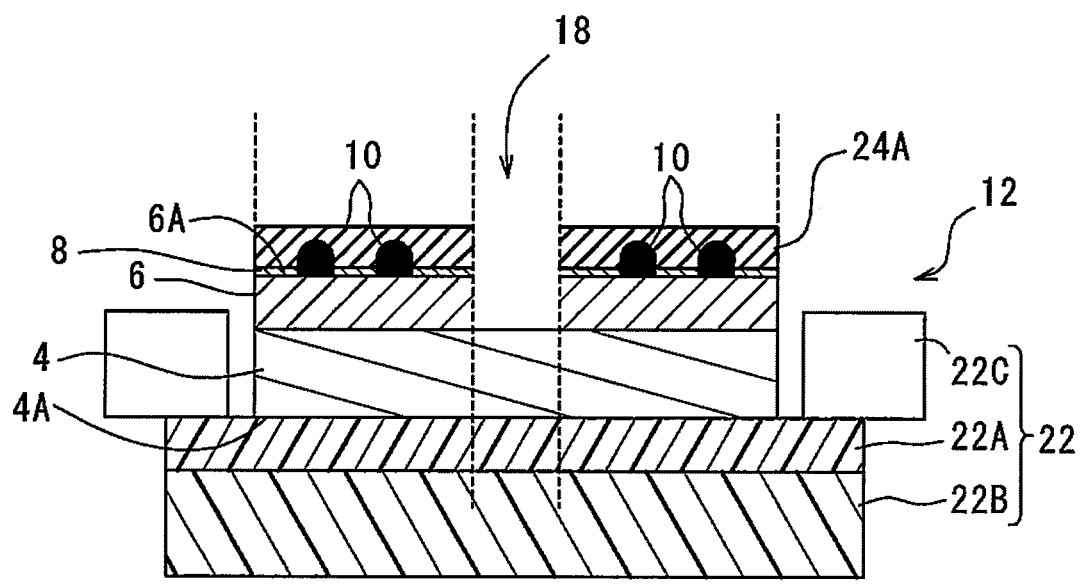
FIG. 1J is a cross-sectional view showing a washing step in the method of manufacturing an element chip.
Figure 1K:
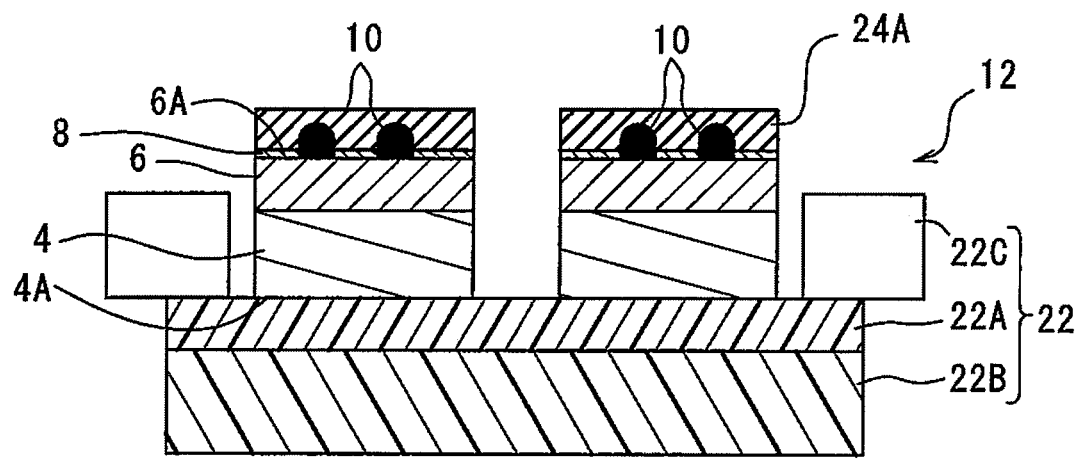
FIG. 1K is a cross-sectional view showing a dicing step in the method of manufacturing an element chip.
Figure 1L:
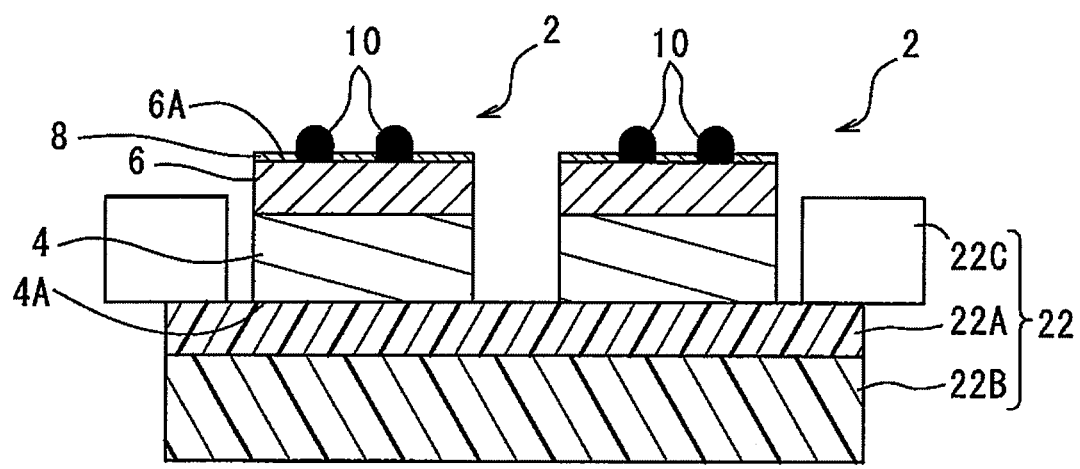
FIG. 1L is a cross-sectional view showing an ashing step in the method of manufacturing an element chip.
Figure 2:
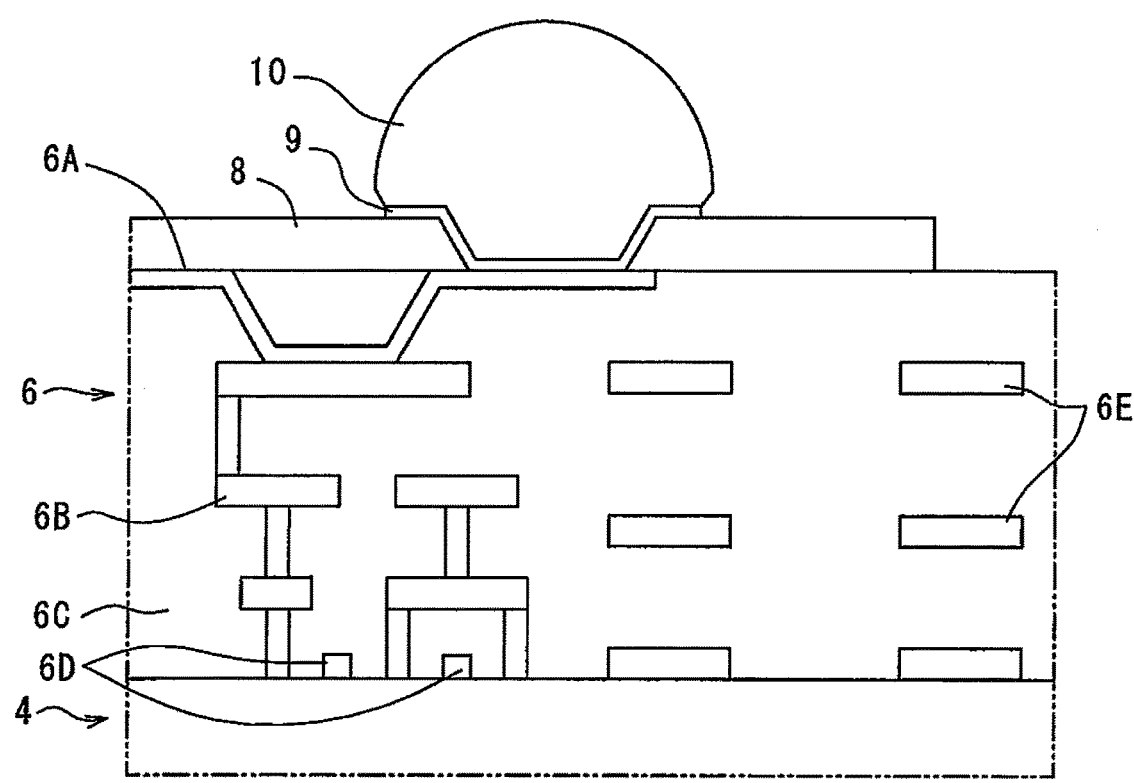
FIG. 2 is a partially enlarged cross-sectional view showing the details of FIG. 1L.

FIGS. 1A to 1L show manufacturing steps of a semiconductor chip (element chip) 2 according to a first embodiment of the present invention. Referring to FIG. 1L as a final step diagram and FIG. 2 as a detailed diagram of the semiconductor chip 2 in combination, the manufactured semiconductor chip 2 includes a semiconductor layer 4, wiring layers 6 formed on the semiconductor layer 4, protective films 8 formed on the respective wiring layers 6, and bumps 10 as electrodes. Note that FIG. 2 is a cross-sectional view, but omits hatching for clarity of illustration. Each bump 10 is generally formed using solder by plating, printing, or vapor deposition. An Under Bump Metal (UBM) film 9 is formed on the protective film 8 of each semiconductor chip 2. Each bump 10 is formed on the UBM film 9. That is, the UBM film 9 is an underlayer for the bump 10, basically has electrical conductivity, and is electrically connected to a metal wiring 6B in the wiring layer 6. The wiring layer 6 is provided with such metal wirings 6B, an insulating film 6C, and transistors 6D. The material of the metal wiring 6B may be, for example, Cu, Al, an Al alloy, W, or the like. The material of the insulating film 6C may be $SiO_2$, SiN, SiOC, a Low-k material, or the like. The metal contained in the bump 10 may be Cu, an alloy of Cu, Sn and Ag, an alloy of Ag and Sn, Au, Al, an Al alloy, or the like. The bump 10 is not particularly limited to a specific shape and may be prism-shaped, cylindrical, convex, hemispherical, and the like. The arrangement and the number of the bumps 10 are not particularly limited and are appropriately set according to the purpose. Here, alternatively, the convex bump 10 as the electrode may be a concave pad electrode. The wiring layer 6 is provided with the metal layers 6E called a Test Element Group (TEG), and more specifically, the metal layers 6E are provided over element regions 14 (see FIG. 1B) and a dividing region 16 (see FIG. 1B).

In the present embodiment, the bump 10 is, for example, a Cu pillar or the like having a diameter of 40 μm and a height of 50 μm. The wiring layer 6 is, for example, a wiring layer having a thickness of approximately 5 μm and including a Low-k material and a Cu wiring.

The semiconductor layer 4 is a semiconductor layer that is made of Si, for example, and has a thickness of 70 μm. For example, an insulating film made of $SiO_2$ and having a thickness of approximately 1 μm may be provided on the side of the semiconductor layer 4 opposite to the wiring layer 6.

In the first preparation step shown in FIG. 1A, a semiconductor wafer (substrate) 12 is prepared. As shown in FIG. 1A, the semiconductor wafer 12 includes the semiconductor layer 4 and the wiring layer 6 formed on the semiconductor layer 4.

In the second preparation step shown in FIG. 1B, the protective film 8 and the bumps 10 are formed on a front surface (first surface) 6A of the wiring layer 6 in the semiconductor wafer 12. The semiconductor wafer 12 obtained through the present step includes the plurality of element regions 14 with the bumps 10 formed thereon, and the dividing region 16 adjacent to the periphery of each individual element region 14. In other words, the individual element regions 14 are defined by the dividing region 16.

In the protection step shown in FIG. 1C, a Back Grinding (BG) tape 20 for protection during grinding of a back surface (second surface) 4A is attached to the front surface 6A of the semiconductor wafer 12. The BG tape 20 is a film including an adhesive layer 20A and a base material layer 20B made of resin. That is, the adhesive layer 20A is attached to the front surface 6A of the semiconductor wafer 12, so that the front surface 6A of the semiconductor wafer 12 is protected by the base material layer 20B. The BG tape 20 is cut along the contour of the semiconductor wafer 12 after or before being attached to the semiconductor wafer 12. Consequently, the handleability of the semiconductor wafer 12 is not impaired. It is noted that the BG tape 20 is a protective tape by way of example.

In the thinning step shown in FIG. 1D, the semiconductor layer 4 is ground from the side of the back surface (second surface) 4A of the semiconductor wafer 12 by a grinder (not shown). The semiconductor wafer 12 is thinned to a predetermined thickness by grinding the semiconductor layer 4.

In the first holding step shown in FIG. 1E, a dicing tape (holding sheet) 22 is attached to the back surface 4A of the semiconductor wafer 12. The dicing tape 22 of the present embodiment is a film including an adhesive layer 22A made of an acrylic-based adhesive and a base material layer 22B made of resin. The adhesive layer 22A is attached to the back surface 4A of the semiconductor wafer 12, so that the semiconductor wafer 12 is held by the base material layer 22B. A frame 22C is attached to the periphery of the dicing tape 22 in consideration of the handleability.

In the second holding step shown in FIG. 1F, the BG tape 20 is peeled off the semiconductor wafer 12. In a state where the BG tape 20 is peeled off, the bumps 10 are exposed on the front surface 6A of the semiconductor wafer 12.

In the first mask formation step shown in FIG. 1G, a lower layer mask 24A having plasma resistance is formed on the front surface 6A of the semiconductor wafer 12. The lower layer mask 24A prevents the surfaces of the elements from being exposed to plasma when plasma dicing is performed in a dicing step mentioned later. The lower layer mask 24A is made of a water-insoluble material and is not removed by washing with water in a washing step mentioned later. The material of the lower layer mask 24A in the present embodiment is, for example, polyolefin. Alternatively, for example, the material of the lower layer mask 24A may be an ethylene vinyl acetate copolymer. In the present embodiment, such formation of the lower layer mask 24A is performed by applying a raw material solution to the front surface 6A of the semiconductor wafer 12 by a spin coating method. It is noted that a formation method of the lower layer mask 24A is not limited to the spin coating method and may be a spray coating method which involves spraying a raw material solution onto the front surface 6A of the semiconductor wafer 12 in the form of mist.

In the second mask formation step shown in FIG. 1H, an upper layer mask 24B is formed on an upper surface of the lower layer mask 24A. The upper layer mask 24B prevents processing waste (debris), generated by laser grooving in a patterning step mentioned later, from directly adhering to the surface of the element. The upper layer mask 24B is made of a water-soluble material, and can be removed by washing with water in the washing step mentioned later. For example, the material of the upper layer mask 24B in the present embodiment is polyvinyl alcohol. Alternatively, for example, the material of the upper layer mask 24B may be a water-soluble polyester. In the present embodiment, such formation of the lower layer mask 24A is performed by applying a raw material solution to the upper surface of the lower layer mask 24A by the spin coating method. It is noted that a formation method of the lower layer mask 24A is not limited to the spin coating method, and may be a spray coating method which involves spraying a raw material solution onto the upper surface of the lower layer mask 24A in the form of mist. Hereinafter, a combination of the lower layer mask 24A and the upper layer mask 24B will be simply referred to as a mask 24.

In the patterning step shown in FIG. 1I, parts of the mask 24 and the semiconductor wafer 12 corresponding to the dividing region 16 (see FIG. 1H) are cut by laser grooving to thereby form an exposed portion 18. In detail, the exposed portion 18 is formed by cutting parts of the wiring layers 6, the protective films 8, and the mask 24. At this time, the semiconductor layer 4 may be partially cut or may not be cut at all, and must not be cut up to the back surface 4A. It is noted that the metal layers, including the insulating film 6C, the metal layers (TEG) 6E, and the like, are provided in the wiring layer 6, but these metal layers are removed by laser to form the exposed portion 18.

Specifically, the process by laser grooving can be performed under the following conditions. As a laser light source, a nanosecond laser having a UV wavelength (for example, 355 nm) is used. The dividing region 16 is irradiated with laser light twice at a pulse cycle of 40 kHz, an output of 0.3 W, and a scanning speed of 200 mm/sec (see FIG. 1H) to remove the mask 24. Then, the dividing region 16 is further irradiated with laser light once at a pulse cycle of 25 kHz, an output of 1.7 W, and a scanning speed of 100 mm/sec to remove the protective film 8 and the wiring layer 6. In this way, the laser irradiation for removing the mask 24 is performed twice on the low output condition, thereby making it possible to prevent peeling of the mask 24 off the semiconductor wafer 12 (delamination). Furthermore, the laser irradiation for removing the wiring layers 6 is performed on the high output condition, so that the wiring layers 6 can be removed even when the wiring layers 6 includes the metal layers (TEG) 6E made of Cu.

As shown in FIG. 1I, when the metal layers (TEG) 6E and the insulating film 6C (made of PI, PBO, SiN, $SiO_2$, low-k, etc.) and the like are processed by the laser grooving, processing waste (debris) D may be generated in some cases. The debris D contains the TEG metal, Si, $SiO_x$, and the like. Consequently, the molten debris D may adhere to the exposed portion 18, or the scattered debris D may adhere to a surface of the upper layer mask 24B. In particular, debris D tends to adhere a lot to a region and its vicinity containing a large amount of TEG metal. If the debris D that adheres to the surface of the upper layer mask 24B generated by the laser grooving is not removed and remains as it is, a subsequent plasma dicing step is adversely affected, causing the formation of a so-called micro mask.

In the washing step shown in FIG. 1J, the debris D is removed together with the upper layer mask 24B by washing with water. As mentioned above, the mask 24 has a double-layer structure that has the lower layer mask 24A and the upper layer mask 24B. As the lower layer mask 24A is not dissolved in water, the lower layer mask 24A can be left as a mask for the subsequent plasma etching after the washing with water. By removing the debris D in this way, the roughness of the surface of the semiconductor chip 2 can be reduced in the plasma dicing step mentioned later. The water washing is preferably performed using warm water, and more preferably performed while bubbling nitrogen gas in order to improve the residue removal efficiency. It is noted that an aqueous solution may be used in place of water.

Similarly, in a drying step shown in FIG. 1J, blow drying with nitrogen gas or the like is performed after the washing step. Alternatively, spin drying may be performed in which a washing solution, such as water, is shaken off with a centrifugal force by spinning a mounting table (not shown) on which the semiconductor wafer 12 is mounted.

In the dicing (plasma dicing) step shown in FIG. 1K, the semiconductor wafer 12 is diced by plasma etching (plasma dicing) while the back surface 4A of the semiconductor wafer 12 is held by the dicing tape 22.

Figure 3:
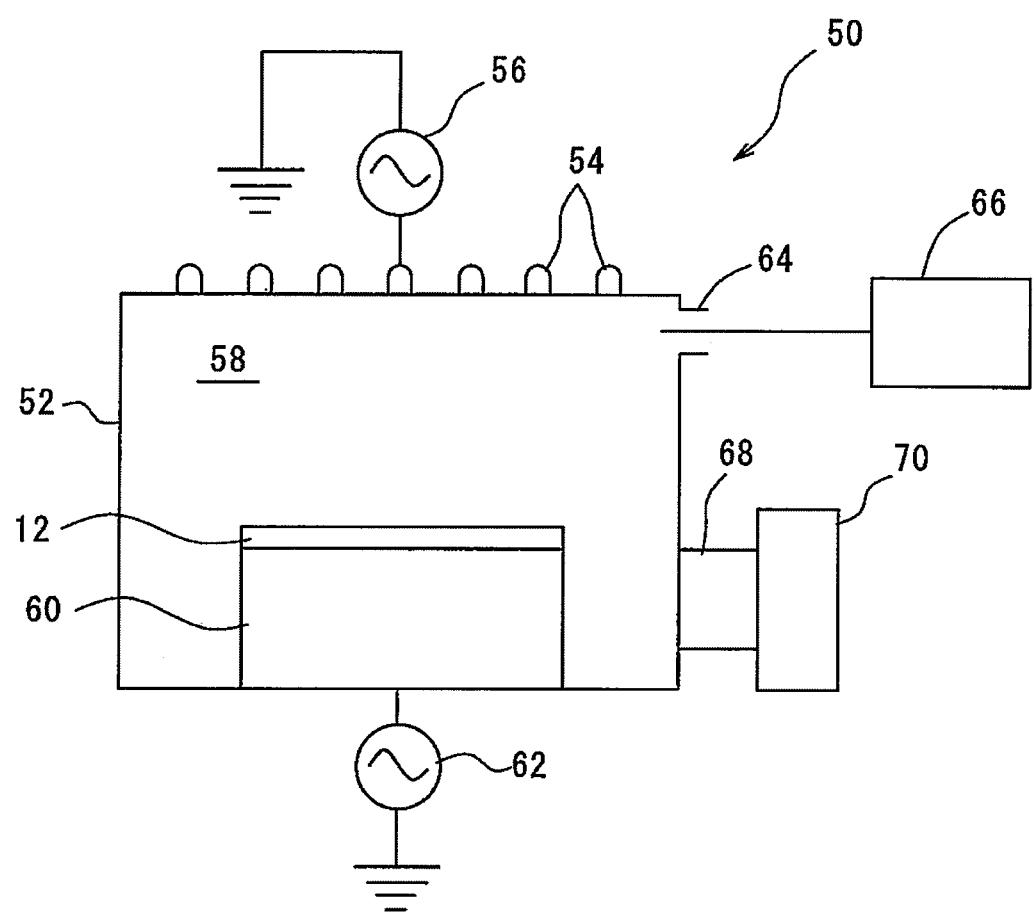
FIG. 3 is a schematic diagram of a dry etching device.

FIG. 3 shows an example of a dry etching device 50 used in the present step. A chamber 52 of the dry etching device 50 has a dielectric window (not shown) provided on its top, and an antenna 54 is disposed as an upper electrode above the dielectric window. The antenna 54 is electrically connected to a first high-frequency power source 56. Meanwhile, a stage 60 on which the semiconductor wafer 12 is placed is disposed at the bottom of a processing chamber 58 in the chamber 52. A refrigerant flow path (not shown) is formed within the stage 60, and a refrigerant is caused to circulate through the refrigerant flow path, thereby cooling the stage 60. The stage 60 also functions as a lower electrode and is electrically connected to a second high-frequency power source 62. Further, the stage 60 includes an electrostatic chuck (ESC) electrode (not shown), so that the dicing tape 22 (i.e., the semiconductor wafer 12) mounted on the stage 60 can be electrostatically attracted onto the stage 60. The stage 60 is provided with a cooling gas hole (not shown) for supplying a cooling gas, and by supplying the cooling gas, such as helium gas, from the cooling gas hole, the semiconductor wafer 12 electrostatically attracted onto the stage 60 can also be cooled. A gas inlet 64 of the chamber 52 is fluidly connected to an etching gas source 66, and an exhaust port 68 is connected to an evacuation portion 70 including a vacuum pump for evacuating the interior of the chamber 52.

In the dicing step, while the semiconductor wafer 12 is placed on the stage 60 via the dicing tape 22 with the interior of the processing chamber 58 evacuated by the evacuation portion 70, an etching gas, e.g., $SF_6$, is supplied from the etching gas source 66 into the processing chamber 58. Then, while the interior of the processing chamber 58 is maintained at a predetermined pressure, a high-frequency power is supplied to the antenna 54 from the first high-frequency power source 56 to generate first plasma in the processing chamber 58. In this way, the semiconductor wafer 12 is irradiated with the first plasma. During this process, the semiconductor layer 4 of the semiconductor wafer 12 exposed at the exposed portion 18 is removed by a physicochemical action of radicals and ions in the first plasma. Through this dicing step, the semiconductor wafer 12 is diced to form individual semiconductor chips 2.

More specifically, the dicing step can include (1) a chucking step, (2) a cleaning step, (3) a surface-oxide removal step, (4) a plasma dicing step, and (5) a $SiO_2$ etching step.

(1) Chucking Step

In the chucking step, low-energy plasma is generated in the chamber 52 before high-energy plasma is generated, so that the semiconductor wafer 12 and the dicing tape 22 mounted on the stage 60 are securely electrostatically attracted onto the stage 60. Consequently, the dicing tape 22 having poor heat resistance is less likely to have thermal damage due to the plasma treatment. For example, weak plasma may be generated for approximately 10 seconds by supplying Ar gas at a speed of 100 sccm while adjusting a chamber pressure to 8 Pa and applying an RF power of 150 W to the antenna 54. At this time, the semiconductor wafer 12 and the dicing tape 22 can be cooled by applying a DC voltage of 3 kV to the ESC electrode while adjusting the temperature of the stage 60 to 20° C. or lower, and supplying He gas at 50 to 200 Pa as the cooling gas between the dicing tape 22 and the stage 60.

(2) Cleaning Step

A cleaning step may be performed using plasma to remove residual debris (for example, metal debris or the like) generated during the laser grooving process and not completely removed in the washing step, as well as a mixed layer containing molten substances of the lower layer mask (e.g., polyolefin or ethylene vinyl acetate copolymer) mentioned above and an amorphous silicon layer or a silicon oxide layer formed of molten Si generated in the laser grooving process. Plasma utilized in the cleaning step is preferably generated using gas species that can remove the silicon and the silicon oxide layer. For example, preferably, the plasma is generated by supplying a mixed gas of $SF_6$ and $O_2$ at 200 sccm while adjusting the chamber pressure to 5 Pa, and applying an RF power of 1,000 to 2,000 W to the antenna 54, and then the wafer is exposed to the generated plasma for approximately one to two minutes. At this time, the cleaning effect can be enhanced by applying an LF power of approximately 150 W to the lower electrode included in the stage 60. To reduce thermal damage caused by plasma generated in the cleaning step, the semiconductor wafer 12 and the dicing tape 22 are preferably cooled in the cleaning step. For example, a DC voltage of 3 kV is applied to the ESC electrode while adjusting the temperature of the stage 60 to 20° C. or lower, and concurrently He gas of 50 to 200 Pa as a cooling gas is supplied between the dicing tape 22 and the stage 60. In this way, the semiconductor wafer 12 and the dicing tape 22 can be cooled.

(3) Surface-Oxide Removal Step

When the above-mentioned cleaning is performed using plasma containing oxygen, the surface of silicon may be oxidized after the cleaning in some cases. As a countermeasure against this, to remove an oxide film formed on the silicon surface in the cleaning step, a surface-oxide removal step may be performed. Plasma utilized in the surface-oxide removal step is preferably generated using gas species that can remove any silicon oxide layer. For example, plasma is generated by supplying $SF_6$ at 200 sccm while adjusting the chamber pressure to 8 Pa and applying an RF power of 2,000 to 5,000 W to the antenna 54. Then, the wafer is desirably exposed to the generated plasma for approximately 2 to 10 seconds. At this time, the surface-oxide removal effect can be enhanced by applying an LF power of approximately 500 W to the lower electrode included in the stage 60. To reduce thermal damage caused by the plasma generated in the surface-oxide removal step, the semiconductor wafer 12 and the dicing tape 22 are preferably cooled in the surface-oxide removal step. For example, a DC voltage of 3 kV is applied to the ESC electrode while adjusting the temperature of the stage 60 to 20° C. or lower, and concurrently He gas is supplied at 50 to 200 Pa as a cooling gas between the dicing tape 22 and the stage 60. In this way, the semiconductor wafer 12 and the dicing tape 22 can be cooled.

(4) Plasma Dicing Step

In the plasma dicing step, the semiconductor layer 4 made of silicon is removed by a BOSCH method. In the BOSCH method, plasma for depositing the protective film and plasma for etching silicon are alternately generated. The plasma for depositing the protective film may be generated, for example, for approximately 2 to 10 seconds by supplying $C_4F_8$ at 300 sccm while adjusting the chamber pressure to 20 Pa and applying an RF power of 2,000 to 5,000 W to the antenna 54. The plasma for etching silicon may be generated, for example, for approximately 5 to 20 seconds by supplying $SF_6$ at 600 sccm while adjusting the chamber pressure to 20 Pa and then applying an RF power of 2,000 to 5,000 W to the antenna 54 and concurrently applying an LF power of 50 to 500 W to the lower electrode. Note that to suppress notching in the processed shape of the semiconductor layer 4, power applied to the lower electrode may be pulsed. A cycle including the occurrence of the plasma for depositing the protective film and the occurrence of the plasma for etching silicon, as mentioned above, is repeated, for example, approximately 20 times, which means i.e., 20 cycles, thereby making it possible to remove appropriate parts of the semiconductor layer 4. Note that to reduce thermal damage caused by the plasma generated in the plasma dicing step, the semiconductor wafer 12 and the dicing tape 22 are preferably cooled in the plasma dicing step. For example, a DC voltage of 3 kV is applied to the ESC electrode while adjusting the temperature of the stage 60 to 20° C. or lower, and concurrently He gas is supplied at 50 to 200 Pa as a cooling gas between the dicing tape 22 and the stage 60. In this way, the semiconductor wafer 12 and the dicing tape 22 can be cooled. It should be noted that if the semiconductor layer 4 has a thickness equal to or less than a specific value, silicon may be continuously etched without using the BOSCH method.

(5) $SiO_2$ Etching Step

In a case where $SiO_2$ or a die attach film (DAF) is formed under the semiconductor layer 4 in the semiconductor wafer 12, the $SiO_2$ or DAF may be processed by performing etching while switching its etching condition after the plasma dicing step. The plasma utilized in the $SiO_2$ etching step is preferably generated using gas species that can remove any silicon oxide layer. For example, desirably, plasma is generated by supplying a mixed gas of Ar and $C_4F_8$ at 300 sccm while adjusting the chamber pressure to 1 Pa and applying an RF power of 500 to 2,000 W to the antenna 54, and then the wafer is exposed to the generated plasma for approximately 2 to 8 minutes. At this time, the $SiO_2$ etching effect can be enhanced by applying an LF power of approximately 500 to 1500 W to the lower electrode included in the stage 60. To reduce thermal damage caused by the plasma generated in the $SiO_2$ etching step, the semiconductor wafer 12 and the dicing tape 22 are preferably cooled in the $SiO_2$ etching step. For example, a DC voltage of 3 kV is applied to the ESC electrode while adjusting the temperature of the stage 60 to 20° C. or lower, and concurrently He gas is supplied at 50 to 200 Pa as a cooling gas between the dicing tape 22 and the stage 60. In this way, the semiconductor wafer 12 and the dicing tape 22 can be cooled.

In the ashing step shown in FIG. 1K, the interior of the processing chamber 58 shown in FIG. 3 is evacuated by the evacuation portion 70, and concurrently an etching gas containing, for example, oxygen is supplied into the processing chamber 58 from the etching gas source 66. Then, while the interior of the processing chamber 58 is maintained at a predetermined pressure, a high-frequency power is supplied from the first high-frequency power source 56 to the antenna 54 to generate the second plasma in the processing chamber 58. Consequently, the semiconductor wafer 12 is irradiated with the generated plasma, that is, the surface of the lower layer mask 24A is exposed to the second plasma. At this time, the lower layer mask 24A is removed by the physicochemical action of radicals and ions in the second plasma.

In order to remove a residual film of the lower layer mask 24A and the debris in the ashing step, a reactive gas, such as $CF_4$, is preferably added to ashing gas, such as oxygen, to thereby enhance the removal effect of the Si, $SiO_x$, or a mask hardened layer. Furthermore, in order to remove metal components, plasma etching is preferably performed under a condition where a bias power is increased to thereby enhance the ionizability (sputterability). The plasma utilized in the ashing step is preferably generated using gas species that can remove a hardened layer and a deteriorated layer as the outermost layer of the lower layer mask 24A, and for example, a mixed gas of $O_2$ and $CF_4$ can be used for the plasma. In the present step, for example, plasma is generated by supplying a mixed gas of $O_2$ and $CF_4$ at 300 sccm while adjusting the chamber pressure to 1 Pa and applying an RF power of 2,000 to 5,000 W to the antenna 54. The wafer is exposed to the generated plasma for approximately 1 to 3 minutes. At this time, by applying the LF power of approximately 100 W to the lower electrode included in the stage 60, the ashing effect can be enhanced. To reduce thermal damage caused by the plasma generated in the ashing step, the semiconductor wafer 12 and the dicing tape 22 are preferably cooled in the surface-oxide removal step. For example, a DC voltage of 3 kV is applied to the ESC electrode while adjusting the temperature of the stage 60 to 20° C. or lower, and concurrently He gas is supplied at 50 to 200 Pa as a cooling gas between the dicing tape 22 and the stage 60. In this way, the semiconductor wafer 12 and the dicing tape 22 can be cooled.

After the above-mentioned ashing step, a dechucking step may be performed to reduce an electrostatic attraction force between the stage 60 and the semiconductor wafer 12 and dicing tape 22. In the dechucking step, weak plasma is generated in the chamber 52 to remove residual charges from the semiconductor wafer 12 and the dicing tape 22 electrostatically attracted onto the stage 60, thereby reducing the electrostatic attraction force between the stage 60 and the semiconductor wafer 12 and dicing tape 22. For example, weak plasma may be generated for approximately 30 to 120 seconds by supplying Ar gas at 100 sccm while adjusting a chamber pressure to 12 Pa and applying an RF power of 150 W to the antenna 54. At this time, preferably, the application of a voltage to the ESC electrode and the supply of the cooling gas are stopped while the temperature of the stage 60 is adjusted to 20° C. or lower, thereby generating weak plasma.

Through the above respective steps, high-quality semiconductor chips 2 are manufactured as products (see FIG. 1L).

Figure 4:
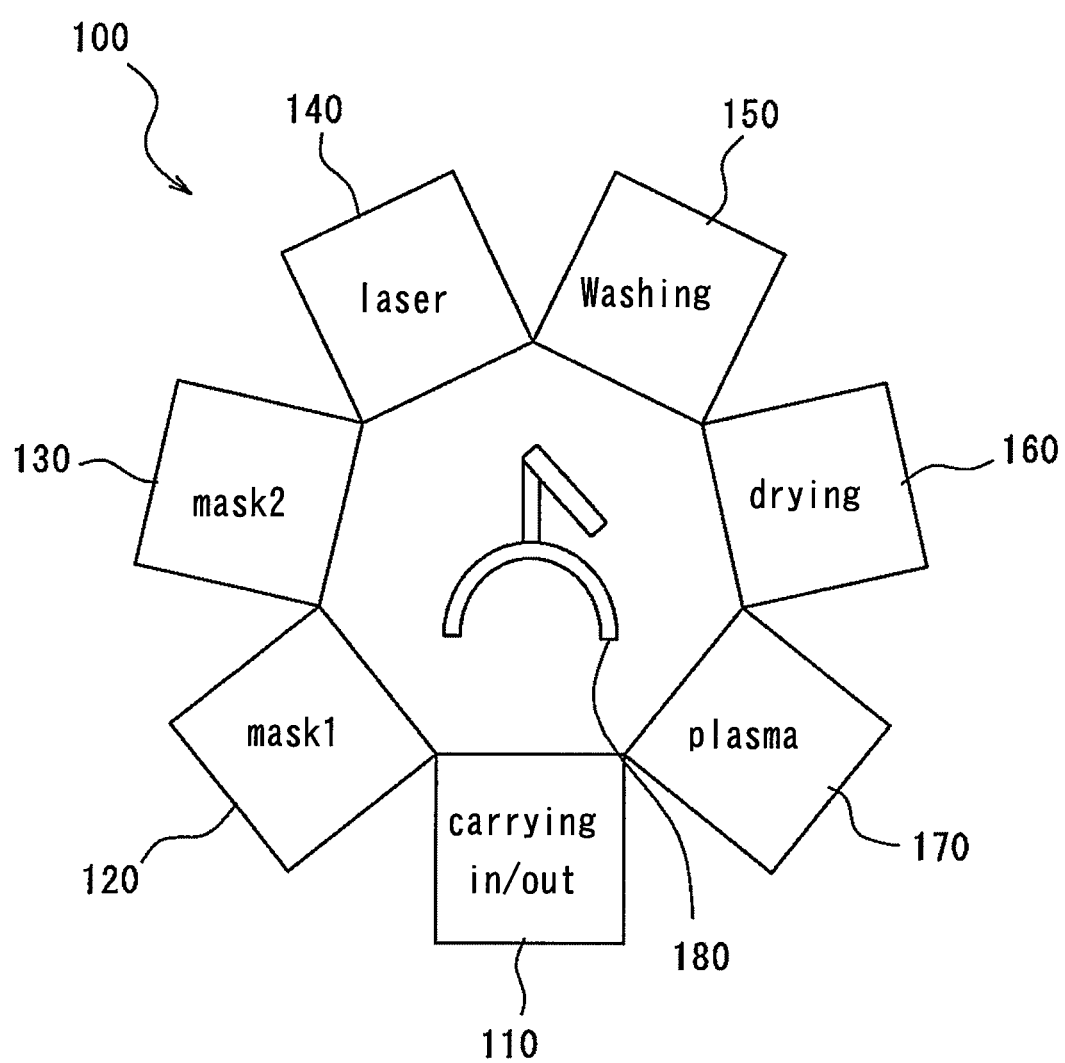
FIG. 4 is an exemplary configuration diagram of a cluster device for executing the method of manufacturing an element chip.

FIG. 4 is an exemplary configuration diagram of a cluster device 100 for executing the method of manufacturing the semiconductor chip 2. A transport mechanism 180 is provided at the center of the cluster device 100, and clusters 110 to 170 corresponding to the above-mentioned respective steps are provided around the transport mechanism 180. However, the arrangements and shapes of the transport mechanism 180 and the clusters 110 to 170 shown in FIG. 4 are conceptual, and do not necessarily coincide with the actual arrangements and shapes.

The transport mechanism 180 is to transport the semiconductor wafer 12 or semiconductor chips 2 obtained by dicing this semiconductor wafer 12 to the respective clusters 110 to 170.

The cluster 110 is a cluster for carrying the semiconductor wafer 12 or semiconductor chips 2 obtained by dicing this semiconductor wafer 12 in and out of the cluster device. Here, the semiconductor wafer 12 carried in the cluster device is in a state of completely undergoing the processes from the first preparation step to the second holding step (see FIG. 1F). The semiconductor chip 2 carried out of the cluster device is in a state of completely undergoing all the above-mentioned steps (see FIG. 1L).

The cluster 120 is a cluster for executing the first mask formation step (see FIG. 1G). The cluster 130 is a cluster for executing the second mask formation step (see FIG. 1H). The cluster 140 is a cluster for executing the patterning step (see FIG. 1I). The cluster 150 is a cluster for executing the washing step (see FIG. 1J). The cluster 160 is a cluster for executing the drying step (as above, see FIG. 1J). The cluster 170 is a cluster for executing the dicing step (see FIG. 1K) and the ashing step (see FIG. 1L). The classification of these clusters 110 to 170 is conceptual and is not necessarily limited to that mentioned above. For example, the cluster 120 for executing the first mask formation step and the cluster 130 for executing the second mask formation step may be the same cluster. In addition, the cluster 150 for executing the water washing process and the cluster 160 for executing the drying process may be the same cluster.

According to the present embodiment, the water-soluble upper layer mask 24B is formed on the front surface 6A of the semiconductor wafer 12 before the laser grooving process in the patterning step, so that debris adhering to the upper layer mask 24B in the subsequent laser grooving process can be removed by washing with water together with the upper layer mask 24B. Therefore, the residual debris in plasma dicing can be suppressed, thereby making it possible to suppress the occurrence of processing defects due to the residual debris in the plasma dicing, thus improving the reliability of the semiconductor chips 2 as the product.

According to the present embodiment, in the ashing step, the water-insoluble lower layer mask 24A can be easily removed by ashing with the second plasma.

According to the present embodiment, in the first mask formation step and the second mask formation step, the upper layer mask 24B and the lower layer mask 24A can be formed by applying a raw material solution. Thus, the upper layer mask 24B and the lower layer mask 24A can be easily formed.

(Second Embodiment)

A method of manufacturing the semiconductor chip 2 according to the present embodiment shown in FIGS. 5A to 5L differs from that of the first embodiment in the method of forming the lower layer mask 24A. Except for this, this method is substantially the same as the method of manufacturing the semiconductor chip 2 according to the first embodiment. Thus, the description of the portions explained in the first embodiment may be omitted.

Figure 5A:
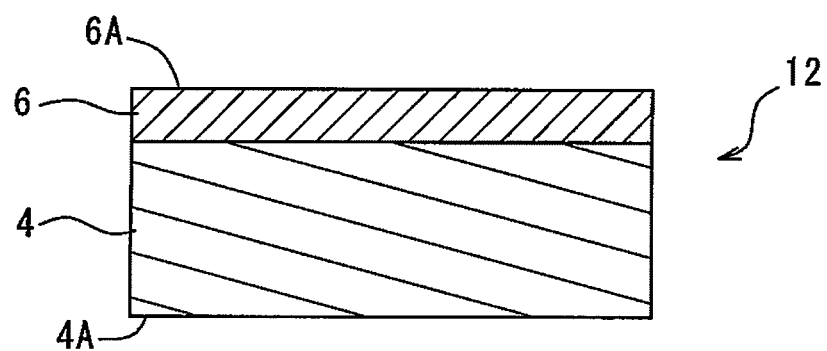
FIG. 5A is a cross-sectional view showing a first preparation step in a method of manufacturing an element chip according to a second embodiment of the present invention.
Figure 5B:
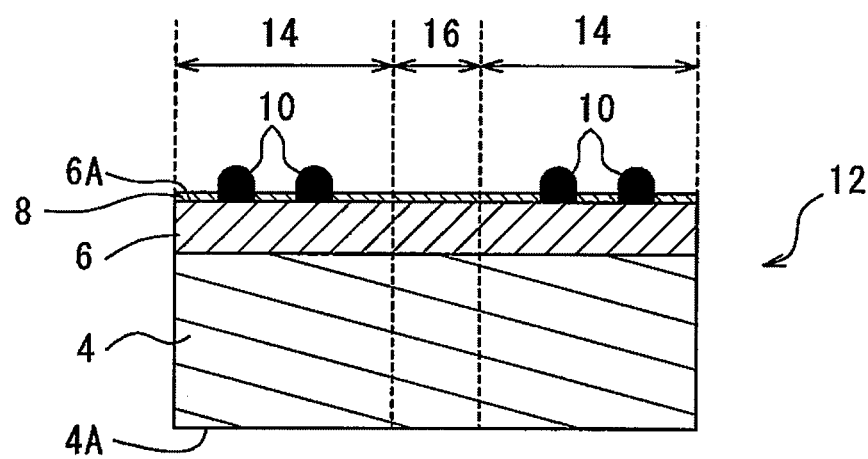
FIG. 5B is a cross-sectional view showing a second preparation step in the method of manufacturing an element chip.
Figure 5C:
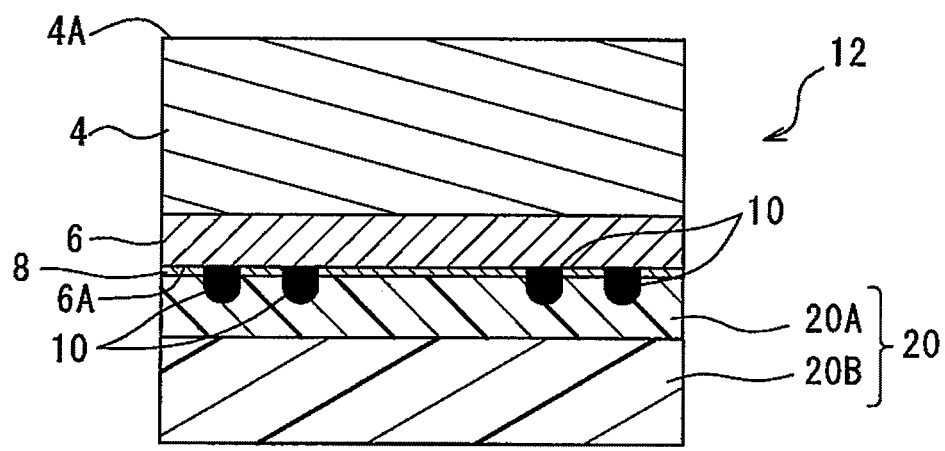
FIG. 5C is a cross-sectional view showing a protection step in the method of manufacturing an element chip.
Figure 5D:
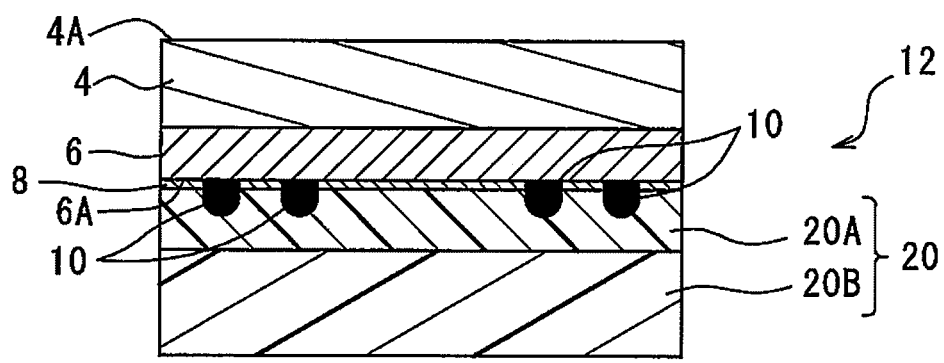
FIG. 5D is a cross-sectional view showing a thinning step in the method of manufacturing an element chip.
Figure 5E:
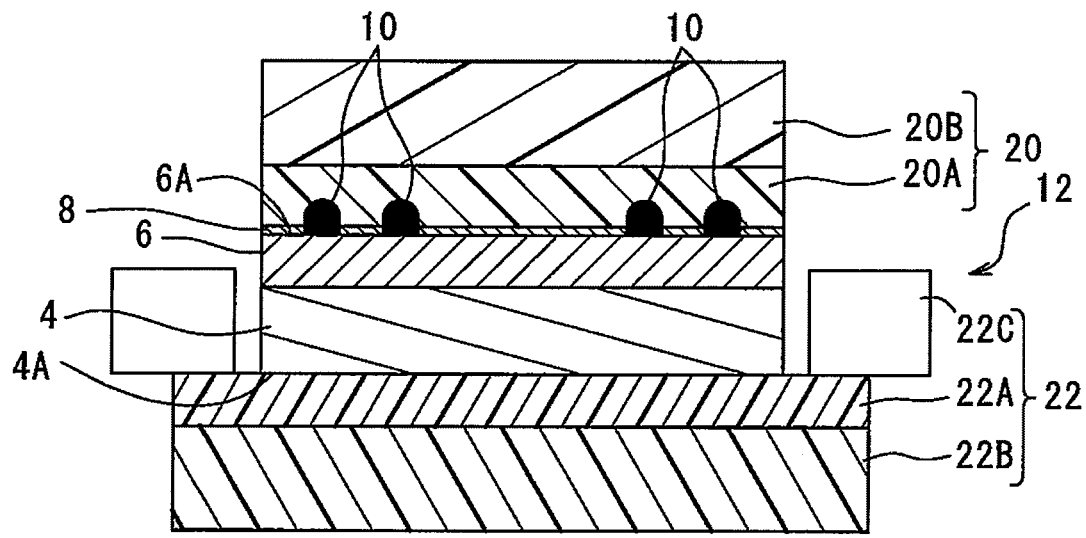
FIG. 5E is a cross-sectional view showing a first holding step in the method of manufacturing an element chip.

A first preparation step shown in FIG. 5A, a second preparation step shown in FIG. 5B, a protection step shown in FIG. 5C, a thinning step shown in FIG. 5D, and a first holding step shown in FIG. 5E are substantially the same as those in the first embodiment. It should be noted that the BG tape 20 used in the present embodiment includes the base material layer 20B and the water-insoluble adhesive layer 20A, and is configured to allow the base material layer 20B to be peeled while leaving the adhesive layer 20A. In particular, the adhesive layer 20A has plasma resistance and hence can protect the element regions 14 from plasma in the dicing step (see FIG. 5J).

Figure 5F:
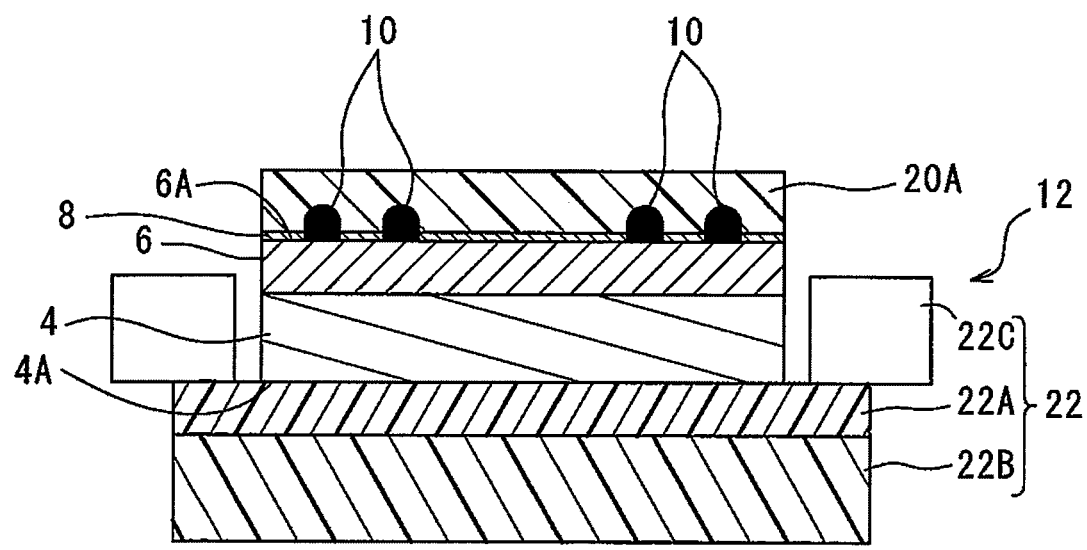
FIG. 5F is a cross-sectional view showing a first mask formation step in the method of manufacturing an element chip.

In a first mask formation step shown in FIG. 5F, only the base material layer 20B of the BG tape 20 is peeled off. That is, the adhesive layer 20A is left and used as the lower layer mask 24A (see FIG. 1G) of the first embodiment.

Figure 5G:
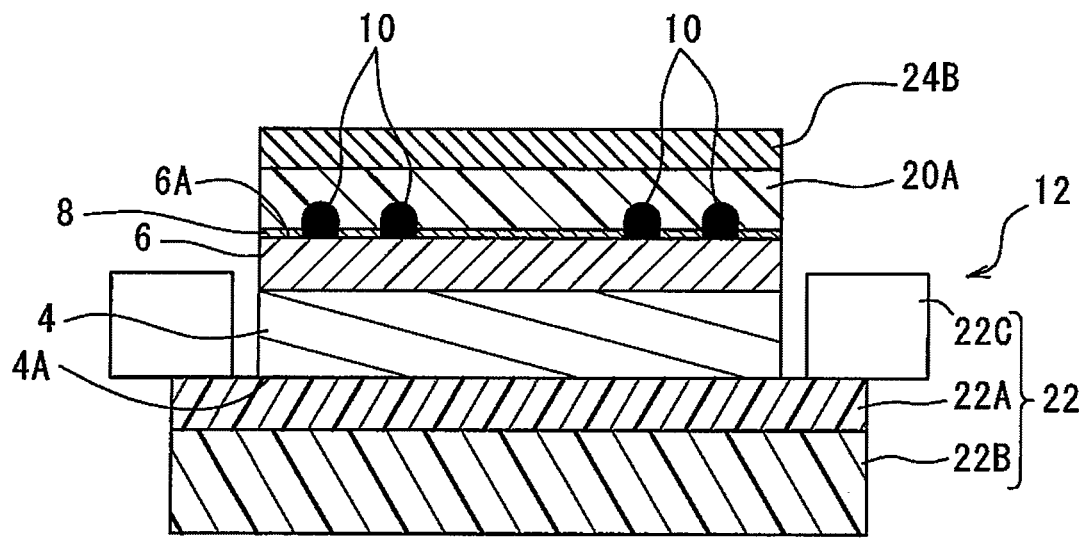
FIG. 5G is a cross-sectional view showing a second mask formation step in the method of manufacturing an element chip.

In a second mask formation step shown in FIG. 5G, an upper layer mask 24B is formed on an upper surface of the adhesive layer 20A. The upper layer mask 24B is the same as that in the first embodiment, and its formation method is also the same as that in the first embodiment.

Figure 5H:
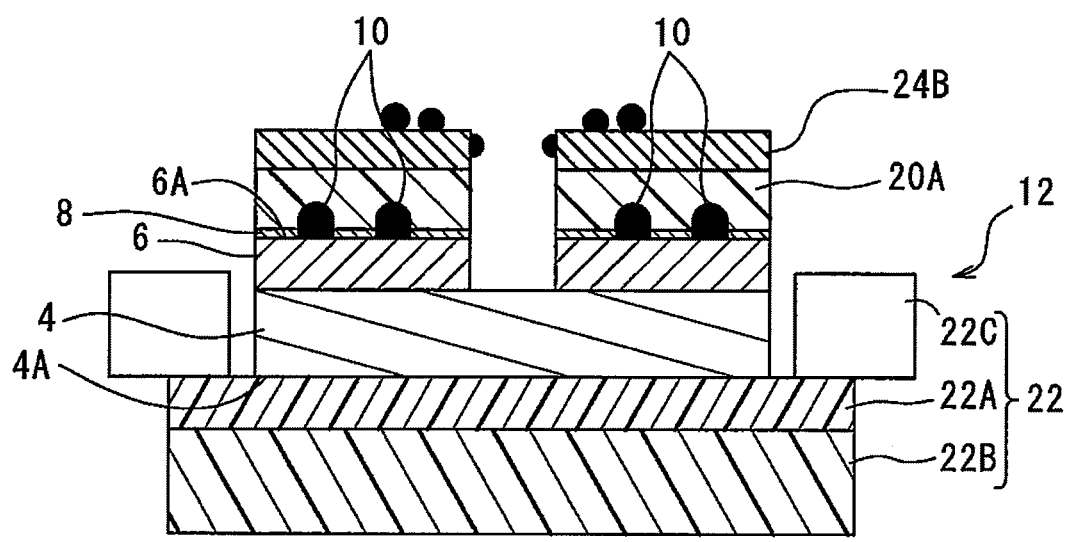
FIG. 5H is a cross-sectional view showing a patterning step in the method of manufacturing an element chip.
Figure 5I:
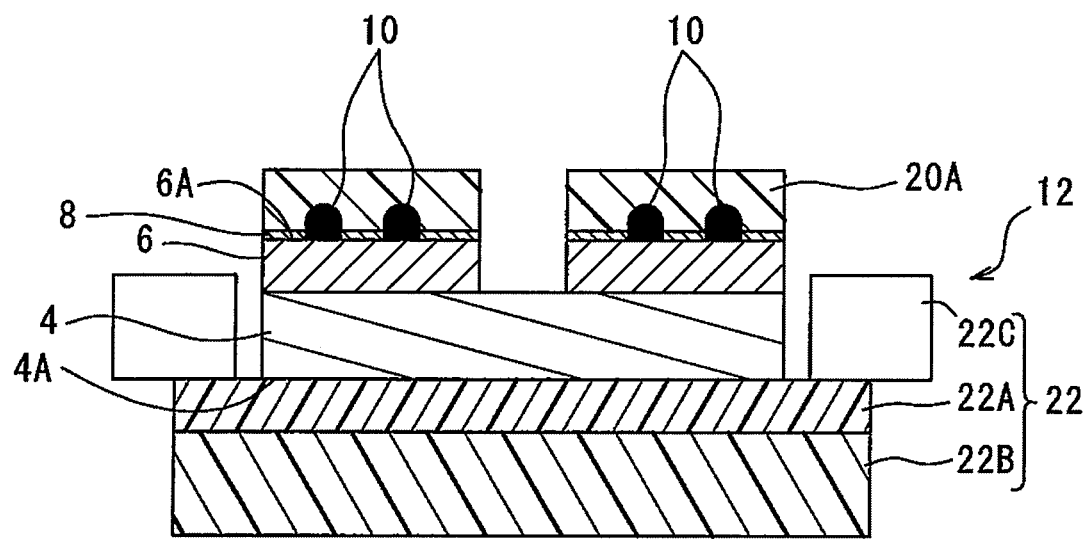
FIG. 5I is a cross-sectional view showing a washing step in the method of manufacturing an element chip.
Figure 5J:
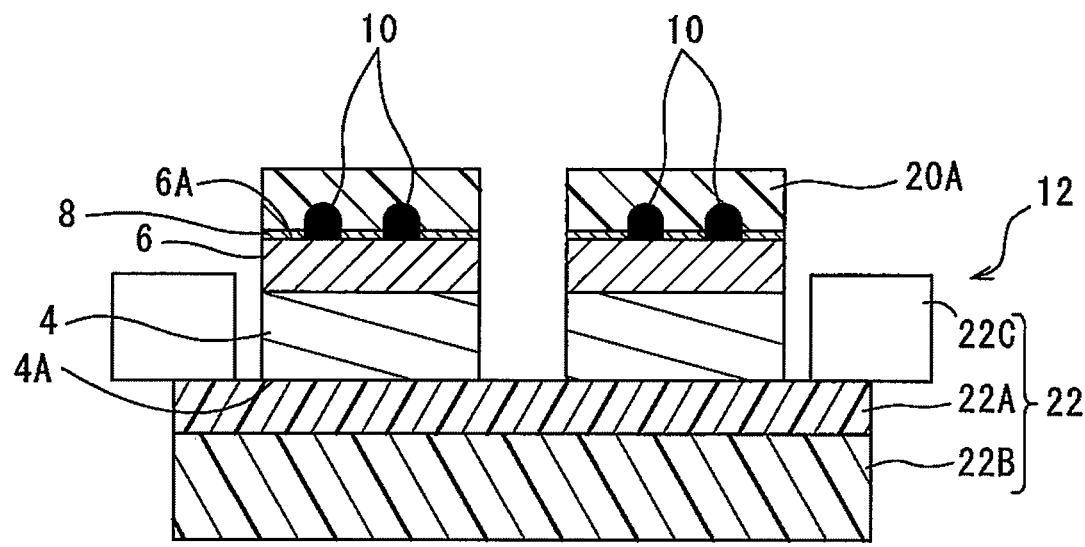
FIG. 5J is a cross-sectional view showing a dicing step in the method of manufacturing an element chip.
Figure 5K:
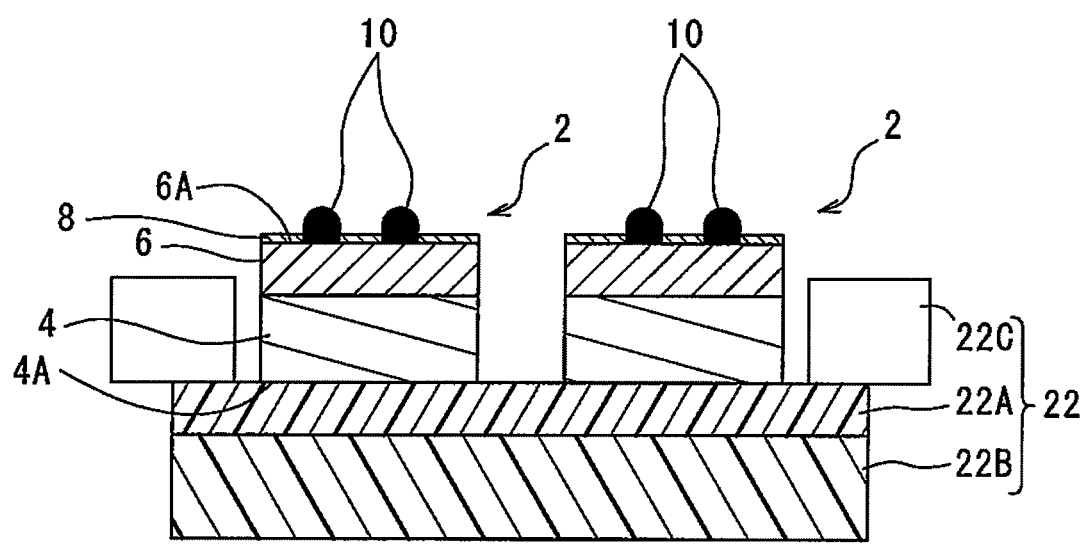
FIG. 5K is a cross-sectional view showing an ashing step in the method of manufacturing an element chip.

A patterning step shown in FIG. 5H, a washing step shown in FIG. 5I, a dicing step shown in FIG. 5J, and an ashing step shown in FIG. 5K are substantially the same as those in the first embodiment except that the lower layer mask 24A of the first embodiment is replaced by the adhesive layer 20A.

Through the above respective steps, high-quality semiconductor chips 2 are manufactured as products (see FIG. 5L).

According to the present embodiment, the adhesive layer 20A of the BG tape 20 can be used as the lower layer mask 24A of the first embodiment, whereby the mask formation step can be simplified.

While specific embodiments of the present invention and modifications thereof have been described above, the present invention is not limited to the above-mentioned embodiments, and various modifications and changes can be made to the embodiments within the scope of the present invention. For example, a combination of the contents of the individual embodiments may also be used as an embodiment of the present invention.

What is claimed is:

1. A method of manufacturing an element chip, comprising:
    preparing a substrate that includes a plurality of element regions and a dividing region defining the element regions, the substrate having a first surface and a second surface opposite to the first surface, wherein the substrate includes a semiconductor layer and a wiring layer formed on the semiconductor layer, and wherein the wiring layer includes an insulating film and a metal layer;
    holding the second surface of the substrate onto a holding sheet;
    coating the first surface of the substrate with a mask, the mask including a water-insoluble lower layer on the first surface of the substrate and a water-soluble upper layer formed on an upper surface of the lower layer;
    forming an opening in the mask by irradiating the mask and the wiring layer with laser light to expose the dividing region of the substrate from the opening, wherein the irradiating with the laser light generates debris containing metal, the debris being adhered to the upper layer of the mask;
    causing the substrate to come into contact with water or an aqueous solution to remove the upper layer of the mask covering each of the element regions together with debris adhered to the upper layer while leaving the lower layer;
    exposing the substrate to first plasma to perform etching on the dividing region exposed from the opening until the etching reaches the second surface, thereby dicing the substrate into a plurality of element chips, so that the plurality of element chips is held on the holding sheet; and
    removing the mask left on a surface of each of the plurality of element chips, so that the plurality of element chips, each having the mask removed therefrom, is held on the holding sheet.

2. The method of manufacturing an element chip according to claim 1, wherein
    the removal of the mask from the surface of each of the plurality of chips includes ashing with second plasma.

3. The method of manufacturing an element chip according to claim 1, wherein
    the coating with the mask includes forming the lower layer by applying a raw material solution containing a water-insoluble resin to the first surface of the substrate held on the holding sheet, and then forming the upper layer by applying a raw material solution containing a water-soluble resin.

4. The method of manufacturing an element chip according to claim 1, wherein
    before holding the substrate on the holding sheet, a protective tape including a base material and a water-insoluble adhesive layer is attached to the first surface via the adhesive layer, and
    the coating with the mask includes peeling the base material of the protective tape from the substrate to leave the adhesive layer as the lower layer on the first surface of the substrate, and then forming the upper layer on the lower layer.

5. The method of manufacturing an element chip according to claim 2, wherein
the coating with the mask includes forming the lower layer by applying a raw material solution containing a water-insoluble resin to the first surface of the substrate held on the holding sheet, and then forming the upper layer by applying a raw material solution containing a water-soluble resin.

* * * * *